United States Patent [19]

Littman et al.

[11] Patent Number: 5,405,709
[45] Date of Patent: Apr. 11, 1995

[54] WHITE LIGHT EMITTING INTERNAL JUNCTION ORGANIC ELECTROLUMINESCENT DEVICE

[75] Inventors: Jon E. Littman, Honeoye Falls; Steve A. VanSlyke, Rochester, both of N.Y.

[73] Assignee: Eastman Kodak Company, Rochester, N.Y.

[21] Appl. No.: 121,712

[22] Filed: Sep. 13, 1993

[51] Int. Cl.$^6$ .............................................. H05B 33/14
[52] U.S. Cl. .................................... 428/690; 428/917; 313/504; 313/501; 313/506
[58] Field of Search .............. 428/690, 917; 313/501, 313/504, 506

[56] References Cited

U.S. PATENT DOCUMENTS

| | | | |
|---|---|---|---|
| 4,539,507 | 9/1985 | Van Slyke et al. | 313/504 |
| 4,720,432 | 1/1988 | Van Slyke et al. | 428/457 |
| 4,769,292 | 9/1988 | Tang et al. | 428/690 |
| 4,885,211 | 12/1989 | Tang et al. | 428/457 |
| 4,950,950 | 8/1990 | Perry et al. | 313/504 |
| 4,983,469 | 1/1991 | Huzino et al. | 428/690 |
| 5,047,687 | 9/1991 | Van Slyke | 313/503 |
| 5,059,861 | 10/1991 | Littman et al. | 313/504 |
| 5,059,862 | 10/1991 | Van Slyke et al. | 313/503 |
| 5,061,569 | 10/1991 | Van Slyke et al. | 428/457 |
| 5,073,466 | 12/1991 | Scozzafava et al. | 428/323 |
| 5,126,214 | 6/1992 | Tokailin et al. | 428/690 |
| 5,141,671 | 8/1992 | Bryan et al. | 252/301.16 |
| 5,150,006 | 9/1992 | Van Slyke et al. | 313/504 |
| 5,151,629 | 9/1992 | Van Slyke | 313/504 |
| 5,283,132 | 2/1994 | Ogura et al. | 428/690 |

OTHER PUBLICATIONS

Kushi et al., "The Crystal and Molecular Structure of Bis(2-methyl-8-quinolinolato) aluminum (III)-μ-ox-o-bis(2-methyl-8-quinolinolato) aluminum (III)", *J. Amer. Chem. Soc.*, 92(1), pp. 91–96 (1970).

Tanaka et al., "Stable White SrS:Ce, K, Eu TFEL with Filters for Full-Color Devices ", *SID 89 Digest*, (1989), pp. 321–324.

*Primary Examiner*—Charles R. Nold
*Attorney, Agent, or Firm*—Raymond L. Owens

[57] ABSTRACT

An internal junction organic electroluminescent device comprises, in sequence, an anode, an organic electroluminescent medium, and a cathode, the organic electroluminescent medium further comprising a hole injecting and transporting zone contiguous with the anode and an electron injecting and transporting zone contiguous with the cathode, the electron injecting and transporting zone further comprising an electron injecting layer in contact with the cathode, characterized in that the portion of the organic electroluminescent medium that is interposed between the electron injecting layer and the hole injecting and transporting zone is capable of emitting white light in response to hole-electron recombination and comprises a fluorescent material and a mixed ligand aluminum chelate of the formula $$(R^s\text{—}Q)_2\text{—Al—O—L}$$

where Q in each occurrence represents a substituted 8-quinolinolato ligand, $R^s$ represents an 8-quinolinolato ring substituent chosen to block sterically the attachment of more than two substituted 8-quinolinolato ligands to the aluminum atoms, O—L is a phenolato ligand, and L is a hydrocarbon group that includes a phenyl moiety.

25 Claims, 1 Drawing Sheet

FIG. 1

WHITE LIGHT EMITTING INTERNAL JUNCTION ORGANIC ELECTROLUMINESCENT DEVICE

FIELD OF THE INVENTION

The invention relates to internal junction organic electroluminescent devices. More specifically, the invention relates to organic electroluminescent devices of the type in which an organic medium contains an internal junction formed at the interface of an electron injecting and transporting zone in contact with a cathode and a hole injecting and transposing zone in contact with an anode.

BACKGROUND OF THE INVENTION

Electroluminescent devices (hereinafter also referred to as EL devices) contain spaced electrodes separated by an electroluminescent medium that emits light in response to the application of an electrical potential difference across the electrodes. Through intensive investigations and a series of recent inventions organic electroluminescent devices of improved characteristics, both in terms of fabrication feasibility and operating performance, have been developed.

In current preferred forms, organic EL devices are comprised of an anode, an organic hole injecting and transporting zone in contact with the anode, an electron injecting and transporting zone forming a junction with the organic hole injecting and transporting zone, and a cathode in contact with the electron injecting and transporting zone. When an electrical potential is placed across the electrodes, holes and electrons are injected into the organic zones from the anode and cathode, respectively. Light emission results from hole-electron recombination within the device.

A class of organic EL devices that have exhibited highly desirable levels of efficiency and stability are those that have employed a metal oxinoid charge accepting compound to form the electron injecting and transporting zone of the organic EL device. The following patents and publications disclose the preparation and utilization of metal oxinoid compounds:

R-1. VanSlyke et al., U.S. Pat. No. 4,539,507, discloses in column 9, lines 14 to 16 inclusive, metal complexes of 8-hydroxyquinoline, where the metal is Zn, Al, Mg, or Li. In Example 9 the metal complex is bis(8-hydroxyquinolino)aluminum and in Example 10, bis(8-hydroxyquinolino)magnesium.

R-2. Tang et al., U.S. Pat. No. 4,769,292, discloses constructing an organic EL device in which the luminescent layer is comprised of a charge accepting host material and a fluorescent material. The host material can be chosen from among diarylbutadienes, stilbenes, optical brighteners, and metal oxinoid compounds, with the following being listed among preferred embodiments: aluminum trisoxine, magnesium bisoxine, bis[benzo{f}-8-quinolino]zinc, indium trisoxine, aluminum tris(5-methyloxine), lithium oxine, gallium trisoxine, calcium bis(5-chlorooxine), poly[zinc(II)-bis(8-hydroxy-5-quinolinyl)methane, dilithium epindolidione, 1,4-diphenylbutadiene, 1,1,4,4-tetraphenylbutadiene, 4,4'-bis[5,7-di(t-pentyl-2-benzoxazolyl]stilbene, 2,5-bis[5,7-di(t-pentyl-2-benzoxazolyl]thiophene, 2,2'-(1,4-phenylene-divinylene)bisbenzothiazole, 4,4'-(2,2'-bis-thiazolylbiphenyl, 2,5-bis[5-$\alpha$,$\alpha$-dimethylbenzyl)-2-benzoxazolyl]thiophene, 2,5-bis[5,7-di(t-pentyl)-2-benzoxazolyl]-3,4-diphenylthiophene, and trans-stilbene.

R-3. VanSlyke et al., U.S. Pat. No. 4,720,432, discloses organic EL devices in which the organic hole injecting and transporting zone is comprised of a layer containing a hole injecting prophyrinic compound in contact with the anode and a layer containing a hole transporting aromatic tertiary amine interposed between the hole injecting layer and the electron injecting and transporting zone. The metal oxinoid charge accepting compounds are those disclosed to form the electron injecting and transporting zone in R-2.

R-4. Tang et al., U.S. Pat. No. 4,885,211, discloses organic EL devices with improved cathodes containing a metal oxinoid compound in the electron injecting and transporting zone. The metal oxinoid charge accepting compounds are those disclosed to form the electron injecting and transporting zone in R-2.

R-5. Perry et al., U.S. Pat. No. 4,950,950, discloses organic EL devices in which the hole injecting and transporting zone is comprised of (a) a layer containing a hole injecting porphyrinic compound in contact with the anode and (b) a layer containing a hole transporting silazane interposed between the hole injecting layer and the electron injecting and transporting zone. The metal oxinoid charge accepting compounds are those disclosed to form the electron injecting and transporting zone in R-2. Aluminum oxinate is set out in the Examples.

R-6. Kushi et al., "The Crystal and Molecular Structure of Bis(2-methyl-8-quinolinoato)aluminum(III)-$\mu$-oxo-bis(2-methyl-8-quinolinolato)aluminum(III)", *J. Amer. Chem. Soc.*, 92(1), pp. 91–96 (1970), discloses the preparation of the title and similar compounds.

Other related patents include the following:

R-7. VanSlyke et al., U.S. Pat. No. 5,059,862, discloses an internal junction organic electroluminescent device comprised of, in sequence, an anode, an organic hole injecting and transporting zone, an organic electron injecting and transporting zone forming a junction with the organic hole injecting and transporting zone, and a cathode comprised of a layer that contacts the organic electron injecting and transporting zone and contains a combination of magnesium and aluminum, with aluminum accounting for at least 80 percent of the cathode layer. The metal oxinoid charge accepting compounds are those disclosed to form the electron injecting and transporting zone in R-2.

R-8. Littman et al., U.S. Pat. No. 5,059,861, discloses an organic electroluminescent device comprised of, in sequence, a support, an anode, an organic electroluminescent medium, and cathode containing a plurality of metals other than alkali metals. The cathode is comprised of a capping layer containing at least one alkaline earth or rare earth metal and an electron injecting layer containing at least one metal having a work function of less than 4.0, but a higher work function than the alkaline earth or rare earth in the capping layer. The metal oxinoid charge accepting compounds are those disclosed to form the electron injecting and transporting zone in R-2.

R-9. VanSlyke, U.S. Pat. No. 5,047,687, discloses an organic electroluminescent device comprised of, in sequence, a support, an anode, an organic electroluminescent medium, and a cathode. The cathode is comprised of a layer containing a plurality of metals (other than alkali metals) having a work function of less than 4 eV. A protective layer overlies the cathode and is comprised of a mixture of at least one organic component of the organic electroluminescent medium and at least one metal having a work function in the range of from 4.0 to 4.5 and capable of being oxidized in the presence of ambient moisture. The metal oxinoid charge accepting compounds are those disclosed to form the electron injecting and transporting zone in R-2.

R-10. Scozzafava et al., U.S. Pat. No. 5,073,446, discloses an organic electroluminescent device comprised of, in sequence, an anode, an organic electroluminescent medium, and a cathode consisting essentially of a plurality of metals other than alkali metals, at least one of the metals having a work function less than that of indium. The cathode is comprised of a layer of fused metal particles containing at least 80 percent indium and having a mean diameter of less than 1 $\mu$m and a coefficient of variation of less than 20 percent. The metal oxinoid charge compounds are those disclosed to form the electron injecting and transporting zone in R-2.

R-11. VanSlyke et al., U.S. Pat. No. 5,061,569, discloses an internal junction organic electroluminescent device comprised of, in sequence, an anode, an organic hole injecting and transporting zone comprised of a layer containing a hole transporting aromatic tertiary amine, an organic electron injecting and transporting zone, and a cathode. The hole transporting aromatic tertiary amine is comprised of at least two tertiary amine moieties and includes attached to a tertiary amine nitrogen atom an aromatic moiety containing at least two fused aromatic rings. The metal oxinoid charge accepting compounds are those disclosed to form the electron injecting and transporting zone in R-2.

R-12. VanSlyke et al., U.S. Pat. No. 5,150,006, discloses an internal junction organic EL device comprised of, in sequence, an anode, an organic hole injecting and transporting zone, an organic electron injecting and transporting zone, and a cathode. The organic electron injecting and transporting zone is comprised of an electron injecting layer in contact with the cathode and, interposed between the electron injecting layer and the organic hole injecting and transporting zone, a blue emitting luminescent layer comprised of an aluminum chelate containing a phenolato ligand and two $R^s$-8-quinolinolato ligands, where $R^s$ substituents are chosen to block the attachment of more than two substituted 8-quinolinolato ring nuclei to the aluminum atom. The presence of the phenolato ligand shifts device emission to the blue region of the spectrum and increases emission efficiency. Device emission at even shorter blue wavelengths and increased operating stability can be realized by the incorporation of a pentacarbocyclic aromatic fluorescent dye.

R-13. VanSlyke, U.S. Pat. No. 5,151,629, discloses an internal junction organic EL device comprised of, in sequence, an anode, an organic hole injecting and transporting zone, an organic electron injecting and transporting zone, and a cathode. The organic electron injecting and transporting zone is comprised of an electron injecting layer in contact with the cathode and, interposed between the electron interjecting layer and the organic hole injecting and transporting zone, a blue emitting luminescent layer comprised of bis ($R^s$-8-quinolinolato) aluminum (III)-$\mu$-oxo-bis ($R^s$-8-quinolinolato) Aluminum (III), where $R^s$ substituents are chosen to block the attachment of more than two substituted 8-quinolinolato ring nuclei to any one aluminum atom. Increased operating stability and device emission at even shorter blue wavelengths can be realized by the incorporation of a pentacarbocyclic aromatic fluorescent dye.

R-14. Bryan et al., U.S. Pat. No. 5,141,671, discloses novel light emitting compositions containing a mixed ligand aluminum chelate having a phenolato ligand and two 8-quinolinolato ligands that are ring substituted to prevent the attachment of three of these ligands to a single aluminum atom. The mixed ligand aluminum chelate can be present in combination with a fluorescent dye in the luminescent composition.

Electroluminescent (EL) devices capable of full color display are highly desirable. Their process of manufacture, however, is very difficult, requiring precise patterning to produce pixels of different colors. The fabrication of inorganic EL devices presents particular problems, requiring high processing temperatures. A white light emitting inorganic EL device containing an SrS:Ce,K,Eu phosphor layer has been described by Tanaka et al. in *SID 89 Digest*, 1989, pages 321-324. Reportedly, this device would allow full color display when used with stacked red, green, and blue colored interference filters. The preparation of the SrS phosphor film, however, required process temperatures of 400°-500° C.

U.S. Pat. No. 4,983,469 discloses an inorganic EL element containing a luminescent film for emitting white light that includes three contiguous layers, one layer with no luminescent center being interposed between two luminescent layers having different luminescent centers.

PROBLEM TO BE SOLVED BY THE INVENTION

Organic EL devices have several potential advantages over inorganic devices, in particular, lower temperatures in the manufacturing process, higher luminescence, and lower drive voltages. However the fabrication of organic devices capable of multicolor image display that contain pixels of different colors requires precise patterning of the electroluminescent medium and an electrode deposited on it, generally by photolithographic techniques, which can result in deterioration in the performance of both medium and electrode relative to that observed with a single color device.

U.S. Pat. No. 5,126,214 discloses an electroluminescent element comprising an electroluminescent part which emits a blue light and a fluorescent material part existing outside of the electroluminescent pan that absorbs the blue light and emits fluorescence in a visible light range from bluish green to red. The disclosed element is purportedly capable of producing white light.

There is a continuing need for electroluminescent devices that are capable of multicolor image display with high resolution and are readily fabricated at convenient processing temperatures and without the employment of complicated patterning techniques. The present invention meets this need.

SUMMARY OF THE INVENTION

In one aspect of the invention, an internal junction organic electroluminescent device comprises, in sequence, an anode, an organic electroluminescent medium, and a cathode, the organic electroluminescent medium further comprising a hole injecting and transporting zone contiguous with the anode and an electron injecting and transporting zone contiguous with the cathode, the electron injecting and transporting zone further comprising an electron injecting layer in contact with the cathode, characterized in that the portion of the organic electroluminescent medium that is interposed between the electron injecting layer and the hole injecting and transporting zone is capable of emitting white light in response to hole-electron recombination and comprises a fluorescent material and a mixed ligand aluminum chelate of the formula $$(R^s-Q)_2-Al-O-L$$

where Q in each occurrence represents a substituted 8-quinolinolato ligand, $R^s$ represents an 8-quinolinolato ring substituent chosen to block sterically the attachment of more than two substituted 8-quinolinolato ligands to the aluminum atoms, O—L is a phenolato ligand, and L is a hydrocarbon group that includes a phenyl moiety.

In another aspect of the invention, the portion of the organic electroluminescent medium that is interposed between the electron injecting layer and the hole injecting and transporting zone comprises a red light emitting electron transporting layer contiguous with the electron injecting layer and a blue light emitting recombination layer contiguous with the hole injecting and transporting zone.

ADVANTAGEOUS EFFECT OF THE INVENTION

The white light emitting organic electroluminescent device of the invention requires no patterning for its fabrication and can be advantageously employed with a readily available color filter array to produce full color flat panel displays.

DESCRIPTION OF PREFERRED EMBODIMENTS

Figure 1:
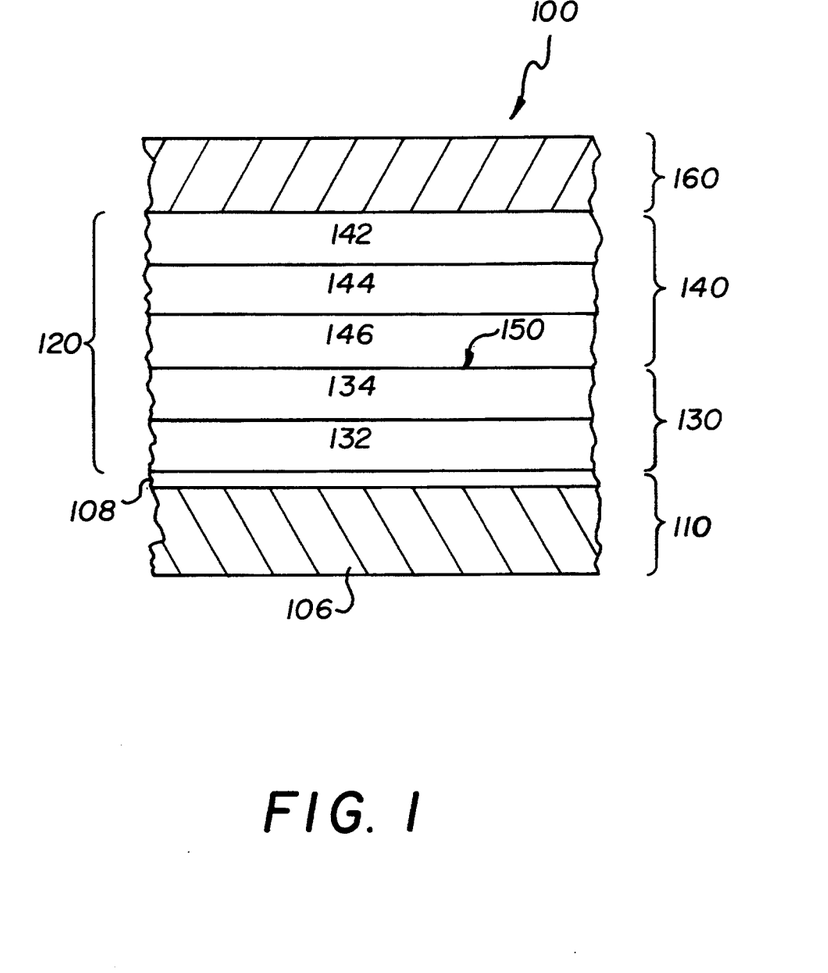
FIG. 1 is a schematic diagram of a white light emitting internal junction organic EL device satisfying the requirements of the invention.

The organic EL device 100 shown in FIG. 1 is illustrative of one preferred embodiment of the invention. Because of the historical development of organic EL devices, it is customary to employ a transparent anode. On a transparent support 106 is coated a thin conductive layer 108 to form the anode 110. Overlying and in contact with the anode is an organic electroluminescent medium 120 formed by a hole injecting and transporting zone 130 in contact with the anode and an electron injecting and transporting zone 140 that forms a junction 150 with the zone 130. The electron injecting and transporting zone is in contact with the cathode 160.

In operation, when the cathode 160 is electrically biased to a negative potential with respect to the anode 110, holes are injected into the hole injecting and transporting zone 130 at its interface with the anode and transported across this zone to the junction 150. Concurrently, electrons are injected into the electron injecting and transporting zone 140 at its interface with the cathode 160, and the injected electrons are transported toward the junction 150. Recombination of the holes and electrons occurs within the electron injecting and transporting zone in close proximity to the junction 150, resulting in electroluminescence within the electron injecting and transporting zone. The hue of the luminescence is determined by the composition of the electron injecting and transporting zone. The light emitted can leave the organic EL device in any direction, i.e., through the edges of the organic medium, the cathode, and/or the anode. In the construction shown, which is most common, emission occurs principally through the transparent anode.

The hole injecting and transporting zone 130 can take any convenient conventional form and can, if desired, be formed of a single material. In the preferred construction shown, the hole injecting and transporting zone consists of a hole injecting layer 132 in contact with the anode 110 and a contiguous hole transporting layer 134 interposed between the hole injecting layer and the electron injecting and transporting zone 140. Unitary and two layer hole injecting and transporting zones are illustrated by the above described patents R-1 through R-5, incorporated herein by reference.

The electron injecting and transporting zone 140 comprises an electron injecting layer 142 that is in contact with the cathode 160, a contiguous broad band red light emitting electron transporting layer 144, and a broad band blue light emitting recombination layer 146 that is interposed between the red emitting electron transport layer and the hole injecting and transporting zone 130, with which it forms a junction 150. If desired, the red light emitting electron transporting layer 144 and the blue light emitting recombination layer 146 can be combined into a single white light emitting layer.

The electron injecting layer 142 preferably employs a metal oxinoid charge accepting compound satisfying the formula where M represents a metal, n is an integer from 1 to 3, and Z represents the atoms necessary, to complete an oxine nucleus.

Illustrative of useful metal oxinoid charge accepting host compounds are the following:

aluminum trisoxine
magnesium bisoxine
bis [benzo{f}-8-quinolinolato]zinc
aluminum tris(5-methyloxine)
indium trisoxine
lithium oxine
gallium tris(5-chloroxine)
calcium bis(5-chloroxine)
aluminum tris(4-methyloxine)
aluminum tris(6-trifluoromethyloxine)

Of the various metal oxinoids, the most preferred are the trisoxine chelates of aluminum, which are formed by reacting three 8-hydroxyquinoline moieties with a single aluminum ion. Suitable electron injecting layers are disclosed in patents R-1 through R-5, incorporated herein by reference.

All of the host materials listed above are known to emit light in response to hole and electron injection. By blending with the host material a minor amount of a fluorescent material capable of emitting light in response to hole-electron recombination, the hue of the light emitted from the luminescent zone can be modified. In theory, if a host material and a fluorescent material could be found for blending which have exactly the same affinity for hole-electron recombination, each material should emit light upon injection of holes and electrons in the luminescent zone. The perceived hue of light emission would be the visual integration of both emissions.

Since imposing such a balance of host and fluorescent materials is highly limiting, it is preferred to choose the fluorescent material so that it provides the favored sites for light emission. When only a small proportion of fluorescent material providing favored sites for light emission is present, peak intensity wavelength emissions typical of the host material can be entirely eliminated in favor of a new peak intensity wavelength emission attributable to the fluorescent material. While the minimum proportion of fluorescent material sufficient to achieve this effect varies by the specific choice of host and fluorescent materials, in no instance is it necessary to employ more than about 10 mole percent fluorescent material, based on moles of host material, and seldom is it necessary to employ more than 1 mole percent of the fluorescent material. On the other hand, for any host material capable of emitting light in the absence of fluorescent material, limiting the fluorescent material present to extremely small amounts, typically less than about $10^{-3}$ mole percent, based on host material, can result in retaining emission at wavelengths characteristic of the host material. Thus, by choosing the proportion of a fluorescent material capable of providing favored sites for light emission, either a full or partial shifting of emission wavelengths can be realized. This allows the spectral emissions of the EL devices of this invention to be selected and balanced to suit the application to be served.

Choosing fluorescent materials capable of providing favored sites for light emission necessarily involves relating the properties of the fluorescent material to those of the host material. The host material can be viewed as a collector for injected holes and electrons, with the fluorescent material providing the molecular sites for light emission. One important relationship for choosing a fluorescent material capable of modifying the hue of light emission when present in a host material is a comparison of the reduction potentials of the two materials. The fluorescent materials demonstrated to shift the wavelength of light emission exhibit a less negative reduction potential than that of the host material. Reduction potentials, measured in electron volts, have been widely reported in the literature along with varied techniques for their measurement. Since it is a comparison of reduction potentials rather than their absolute values that is desired, it is apparent that any accepted technique for reduction potential measurement can be employed, provided both the fluorescent and host material reduction potentials are similarly measured. A preferred oxidation and reduction potential measurement technique is reported by R. J. Cox, *Photographic Sensitivity*, Academic Press, 1973, Chapter 15.

A second important relationship for choosing a fluorescent material capable of modifying the hue of light emission when present in a host material is a comparison of the bandgap potentials of the two materials. The fluorescent materials demonstrated to shift the wavelength of light emission have exhibited a lower bandgap potential than that of the host material. The bandgap potential of a molecule is taken as the potential difference in electron volts (eV) separating its ground state and first singlet state. Bandgap potentials and techniques for their measurement have been widely reported in the literature. The bandgap potentials herein reported are those measured in electron volts (eV) at an absorption wavelength which is bathochromic to the absorption peak and of a magnitude one tenth that of the magnitude of the absorption peak. Since it is a comparison of bandgap potentials rather than their absolute values that is desired, it is apparent that any accepted technique for bandgap measurement can be employed, provided both the fluorescent and host material bandgaps are similarly measured. One illustrative measurement technique is disclosed by F. Gutman and L. E. Lyons, *Organic Semiconductors*, Wiley, 1967, Chapter 5.

Where a host material is chosen which is itself capable of emitting light in the absence of the fluorescent material, it has been observed that suppression of light emission at the wavelengths of emission characteristics of the host material alone and enhancement of emission at wavelengths characteristic of the fluorescent material occurs when spectral coupling of the host and fluorescent materials is achieved. By spectral coupling it is meant that an overlap exists between the wavelengths of emission characteristic of the host material alone and the wavelengths of light absorption of the fluorescent material in the absence of the host material. Optimal spectral coupling occurs when the maximum emission of the host material alone substantially matches within ±25 nm the maximum absorption of the fluorescent material alone. In practice, advantageous spectral coupling can occur with peak emission and absorption wavelengths differing by up to 100 nm or more, depending on the width of the peaks and their hypsochromic and bathochromic slopes. Where less than optimum spectral coupling between the host and fluorescent materials is contemplated, a bathochromic as compared to a hypsochromic displacement of the fluorescent material produces more efficient results.

Although the foregoing discussion has been undertaken by reference to host materials which themselves are known to emit light in response to hole and electron injection, in fact light emission by the host material itself can entirely cease where light emission by the fluorescent material is favored by any one or combination of the various relationships noted above. It is appreciated that shifting the role of light emission to the fluorescent material allows a still broader range of choices of host materials. For example, one fundamental requirement of a material chosen to emit light is that it must exhibit a low extinction coefficient for light of the wavelength it emits to avoid internal absorption. The present invention permits use of host materials which are capable of sustaining the injection of holes and electrons, but are themselves incapable of efficiently emitting light.

Useful fluorescent materials are those capable of being blended with the host material and fabricated into thin films that comprise the electron injecting and transporting zones of the EL devices of this invention. While crystalline host materials do not lend themselves to thin film formation, the limited amounts of fluorescent materials present in the host material permit the use of fluorescent materials that alone are incapable of thin film formation. Preferred fluorescent materials are those which form a common phase with the host material. Fluorescent dyes constitute a preferred class of fluorescent materials, since dyes lend themselves to molecular level distribution in the host material. Although any convenient technique for dispersing the fluorescent dyes in the host materials can be undertaken, preferred fluorescent dyes are those which can be vacuum vapor deposited along with the host materials. Assuming other criteria, noted above, are satisfied, fluorescent laser dyes are recognized to be particularly useful fluorescent materials for use in the organic EL devices of this invention.

It is possible to produce an organic electroluminescent device that emits white light by combining fluorescent materials that emit broad band red light and broad band blue light because both the red and blue light emitters also emit substantial amounts of green light. Thus, red and blue fluorescing materials can be combined in appropriate concentrations with a single host material in a single layer to produce emitted white light. Preferably, the red and blue light emitting materials are each included with a host material in two individual layers close to the hole transporting layer. In either the single layer or double layer format, the neutral color balance resulting in white light emission is controlled by the relative concentrations of the red and blue light emitting materials; the concentrations of each required depend on several factors, including the relative fluorescent efficiency of the light emitting materials in their respective hosts and their nonradiative energy transfer rates.

In a preferred embodiment, the red light emitting electron transporting layer 144 comprises a host compound as described above for the electron injecting layer 142 and a minor amount of a fluorescent material capable of emitting broad band red light in response to hole-electron recombination. As discussed above, the amount of included fluorescent material can be from $10^{-3}$ to 10 mole percent based on the moles of host compound, preferably no more than 1 mole percent. Preferred fluorescent materials include polymethine dyes, for example, carbocyanines and dicarbocyanines such as those listed in columns 20–27 of U.S. Pat. No. 4,769,292; dicyanomethylenepyran and dicyanomethylenethiopyran dyes, such as those described in column 13 of U.S. Pat. No. 4,769,292; pyrylium and thiapyrylium dyes disclosed in U.S. Pat. No. 3,615,414 and in column 32 of U.S. Pat. No. 4,769,292; these disclosures are all incorporated herein by reference.

The blue light emitting recombination layer 146 comprises a combination of host compound and a fluorescent material capable of emitting broad band blue light. Preferably, the host compound is a mixed ligand aluminum chelate, specifically a bis($R^s$-8-quinolinolato)(phenolato)aluminum(III) chelate serving as a charge accepting compound, where $R^s$ is a ring substituent of the 8-quinolinolato ring nucleus chosen to block the attachment of more than two 8-quinolinolato ligands to the aluminum atom. These compounds can be represented by the formula $$(R^s\text{—}Q)_2\text{—Al—O—L}$$

where Q in each occurrence represents a substituted 8-quinolinolato ligand, $R^s$ represents an 8-quinolinolato ring substituent chosen to block sterically the attachment of more than two substituted 8-quinolinolato ligands to the aluminum atom, O—L is a phenolato ligand, and L is a hydrocarbon group of from 6 to 24 carbon atoms that includes a phenyl moiety.

If it is desired to combine the red light emitting electron transporting layer 144 and the blue light emitting recombination layer 146 into a single white light emitting layer, a mixed ligand aluminum chelate is employed as the host compound, which is blended with minor amounts of each of one or more fluorescent materials capable of emitting broad band red light and one or more fluorescent materials capable of emitting broad band blue light, the concentrations of each of the materials being selected to produce white emitted light.

The advantage of employing an aluminum chelate with two substituted 8-quinolinolato ligands and a phenolato ligand is that all of the desirable physical properties of tris(8-quinolinolato)aluminum(III) chelates, the preferred green emitting luminophors of organic EL devices, are retained while emission is shifted to the blue region of the spectrum. More specifically, the combination of two substituted 8-quinolinolato ligands and a phenolato ligand produces an aluminum chelate that can be deposited from the vapor phase to form the electron transporting layer of the organic EL device. Vapor phase deposition is the preferred approach to construction of the organic layer sequence of organic EL devices, allowing extremely thin layers of well controlled thickness and uniformity to be deposited. No solvents or other extraneous materials need be used that might dissolve, contaminate or degrade the performance of the deposition substrate, the hole injecting and transporting zone. Vapor phase deposition has the further advantage of allowing the rate of deposition to be controlled and of allowing greater freedom and flexibility in device construction.

The presence of the phenolato ligand is responsible for shifting emissions to the blue portion of the spectrum. As employed herein, the term "phenolato ligand" is employed in its art recognized usage to mean a ligand bonded to the aluminum atom by the deprotonated hydroxyl group of a phenol. In its simplest form the phenolato ligand can be provided by deprotonation of hydroxybenzene.

In an effort to improve performance, substituted phenols were investigated. Methoxy and dimethoxy substituted phenolato ligands were found to exhibit relatively weak luminescent intensities. Since methoxy substituents are electron donating, phenols with strongly electron withdrawing substituents, such as halo, cyano and α-haloalkyl substituents, were also investigated. Aluminum chelates with these ligands, though luminophors, did not undergo successful vapor phase conversions.

It has been determined that the preferred phenolato ligands for the mixed ligand aluminum chelates are derived from HO—L phenols, where L is a hydrocarbon group of from 6 to 24 carbon atoms that includes a phenyl moiety. This includes not only hydroxybenzene, but a variety of hydrocarbon substituted hydroxybenzenes, hydroxynaphthalenes and other fused ring hydrocarbons. Since monomethyl substitution of the phenyl moiety shortens emission wavelengths, it is preferred that the phenolato ligand contain at least 7 carbon atoms. Generally there is little advantage to be gained by employing phenolato ligands with very large numbers of carbon atoms. However, investigations of phenolato ligands with 18 aromatic ring carbon atoms have revealed high levels of stability. Thus, the phenolato ligands preferably contain from 7 to 18 total carbon atoms.

Aliphatic substituents of the phenyl moiety of the phenolato ligand are contemplated to contain from 1 to 12 carbon atoms each. Alkyl phenyl moiety substituents of from 1 to 3 carbon atoms are specifically preferred, with the best overall characteristics having been observed to be produced with methyl substituents.

Aromatic hydrocarbon substituents of the phenyl moiety are preferably phenyl or naphthyl rings. Phenyl, diphenyl and triphenyl substitution of the phenyl moiety have all been observed to produce highly desirable organic EL device characteristics.

Phenolato ligands derived from α- or β-naphthols have been observed to produce aluminum chelates of exceptional levels of stability. A limited degree of emission shifting to shorter wavelengths is also realized, similar to that exhibited by hydroxybenzene derived phenolato ligands. By employing naphtholato ligand containing aluminum chelates in combination with blue emitting fluorescent dyes, described below, highly desirable device constructions are possible.

From comparisons of ortho, meta and para substituted homologs of the various phenolato ligands it has been determined that little, if any, difference in performance is attributable to the position on the phenyl moiety occupied by the hydrocarbon substituent.

Although either or both of the 8-quinolinolato rings can contain substituents other than the steric blocking substituent, further substitution of the rings is not required. It is appreciated further that more than one substituent per ring can contribute to steric blocking. The various steric blocking substituent possibilities are most easily visualized by reference to the following formula:

where L can take any form described above and $R^2$ to $R^7$ represent substituents at each of ring positions 2 to 7 of the 8-quinolinolato rings. Substituents at the 4, 5 and 6 ring positions are not favorably located to hinder sterically the bonding of three 8-quinolinolato nuclei to a single aluminum atom. While it is contemplated that large substituents at the 3 or 7 ring positions could provide sufficient steric hindrance, the incorporation of bulky substituents substantially increases molecular weight without enhancing molecular performance and therefore detracts from overall performance. On the other hand, the 2 ring position is suited to provide steric hindrance, and even a very small substituent, e.g., a methyl group, in one of these ring positions provides an effective steric blocking substituent. For synthetic convenience it is specifically preferred that steric blocking substituents be located in the 2 ring positions. As employed herein, the term "steric blocking" is employed to indicate that the $R^5$—Q ligand is incapable of competing for inclusion as the third ligand of the aluminum atom.

Although the phenolato ligand is primarily relied upon to obtain blue emission, it has been observed that substituents to the 8-quinolinolato rings can also perform useful hue shifting functions. The quinoline ring consists of fused benzo and pyrido rings. When the pyrido ring component of the quinoline ring is substituted with one or more electron donating substituents, emission is shifted away from the green region of the spectrum and toward a more primary blue emission. Electron donating substituents at the ortho and para positions of the pyrido ring (the 2 and 4 positions of the quinoline ring) particularly influence the hue of emission, while the meta position on the pyrido ring (the 3 position on the quinoline ring) has a comparatively small influence on the hue of emission. It is, in fact, recognized that an electron accepting substituent could, if desired, be located at the 3 ring position while retaining a blue emission characteristic. Although steric hindrance is entirely independent of electron donating or accepting properties and $R^2$ can thus in theory take the form of either an electron donating or accepting group, it is preferred to choose $R^2$ from among electron donating groups. By adding a second electron donating group $R^4$, a further shift in hue away from the green portion of the spectrum is achieved. $R^3$, when present, can take any synthetically convenient form, but is preferably also electron donating.

Electron accepting substituents of the benzo ring component of the quinoline nucleus shift the hue of emission hypsochromically, i.e., towards the blue. Thus, any or all of substituents at the 5, 6 and 7 quinoline ring positions, when present, are preferably electron accepting.

It is well within the skill of the art to determine whether a particular substituent is electron donating or electron accepting. The electron donating or accepting properties of several hundred of the most common substituents, reflecting all common classes of substituents have been determined, quantified, and published. The most common quantification of electron donating and accepting properties is in terms of Hammett $\sigma$ values. Substituents with negative Hammett $\sigma$ values are electron donating, while those with positive Hammett $\sigma$ values are electron accepting. Hydrogen has a Hammett $\sigma$ value of zero, while other substituents have Hammett $\sigma$ values that increase positively or negatively in direct relation to their electron accepting or donating characteristics. *Lange's Handbook of Chemistry*, 12th Ed., McGraw Hill, 1979, Table 3-12, pp. 3-134 to 3-138, lists Hammett $\sigma$ values for a large number of commonly encountered substituents. Hammett $\sigma$ values are assigned based on phenyl ring substitution, but they provide a workable guide for qualitatively selecting electron donating and accepting substituents for the quinoline ring.

Taking all factors together, steric blocking, synthetic convenience, and electron donating or accepting properties, $R^2$ is preferably an amino, oxy or hydrocarbon substituent. Adequate steric hindrance is provided when $R^2$ is methyl and is the sole 8-quinolinolato ring substituent, i.e., each of $R^3$, $R^4$, $R^5$, $R^6$ and $R^7$ is hydrogen. Thus, any amino, oxy or hydrocarbon substituent having at least 1 carbon atom falls within the purview of preferred substituents. Preferably no more than 10 carbon atoms and optimally no more than 6 carbon atoms are present in any one hydrocarbon moiety. Thus, $R^2$ preferably takes the form of —R′, —OR′ or —N(R″)R′, where R′ is a hydrocarbon of from 1 to 10 carbon atoms and R″ is R′ or hydrogen. Preferably $R^2$ contains 10 or fewer carbon atoms and optimally 6 or fewer carbon atoms.

$R^3$ and $R^4$ for the reasons set forth above can take a broader range of forms than $R^2$, but are specifically contemplated to be selected from among the same group of preferred substituents as $R^2$. Since 3 and 4 ring position substitution is not required, $R^3$ and $R^4$ can additionally be hydrogen.

Since 5, 6 or 7 ring position substitution is not required, $R^5$, $R^6$ and $R^7$ can represent hydrogen. In preferred forms, $R^5$, $R^6$ and $R^7$ can be selected from synthetically convenient electron accepting substituents, such as cyano, halogen, and α-haloalkyl, α-haloalkoxy, amido, sulfonyl, carbonyl, carbonyloxy and oxycarbonyl substituents containing up to 10 carbon atoms, most preferably 6 or fewer carbon atoms.

The following constitute specific examples of preferred mixed ligand aluminum chelates useful for the practice of the present invention; other suitable materials are shown in columns 12-17 of U.S. Pat. No. 5,150,006, the disclosures of which are incorporated herein by reference:

-continued

It is specifically contemplated to incorporate in the blue light emitting recombination layer 146 fluorescent dyes following the teachings of Tang et al., U.S. Pat. No. 4,769,292, (R-2), VanSlyke et al., U.S. Pat. No. 5,150,006 (R-12), and VanSlyke, U.S. Pat. No. 5,151,629

(R-13), all cited above, the disclosures of which are incorporated herein by reference. Blue light emitting combinations of one or more fluorescent dyes and mixed ligand aluminum chelates, as described above, can be employed. Three distinctly different categories of combination are possible that permit blue emission:

In a first category, a blue light emitting recombination layer can be constructed by employing a charge accepting mixed ligand aluminum chelate as a host compound for a blue light emitting fluorescent dye chosen to provide a favored recombination site for holes and electrons. In this arrangement, the host and fluorescent dye relationship taught by Tang et al. (R-2) is present; the mixed ligand aluminum chelates serve as collectors for charge (holes and electrons) accepted into the electroluminescent zone, with the wavelength of emission being controlled by the fluorescent dye. Within this relationship, the fluorescent dye exhibits a less negative reduction potential and a lower bandgap potential than that of the host compound, and the host compound and fluorescent dye are spectrally coupled, i.e., the host compound has a capability when used alone to emit at a wavelength that corresponds to an absorption wavelength of the fluorescent dye. For optimum coupling, it is preferred that the peak emission wavelength of the host correspond to the peak absorption wavelength of the fluorescent dye within ±100 nm, optimally ±25 nm. Blue emitting fluorescent dyes are required in this instance, since the hue of emission is entirely determined by the fluorescent dye.

In a second category, the relationships and roles of the mixed ligand aluminum chelate and the fluorescent dye are simply reversed. The fluorescent dye acts as the host compound, while the aluminum chelate compound is responsible for blue light emission. For this relationship to be favored, the aluminum chelate compound exhibits a less negative reduction potential and a lower bandgap potential than that of the host compound, and the host dye compound and the mixed ligand aluminum chelate are spectrally coupled, i.e., the host compound has a capability when used alone to emit at a wavelength that corresponds to an absorption wavelength of the aluminum chelate compound. For optimum coupling, it is preferred that the peak emission wavelength of the host dye correspond to the peak absorption wavelength of the aluminum chelate compound within ±100 nm, optimally ±25 nm.

When neither of the first and second category conditions are sufficiently satisfied to allow emission solely from the fluorescent dye or the mixed ligand aluminum chelate, as contemplated by the first and second categories above, respectively, a third category is present in which each of the fluorescent dye and the aluminum chelate compound emits at the same wavelength as it emits in the absence of the other. In this instance, it is preferred that both the mixed ligand aluminum chelate and the fluorescent dye be blue light emitting.

By choosing a fluorescent dye having a peak emission at a shorter wavelength than that of the mixed ligand aluminum chelate, a shift to shorter wavelength organic EL device emissions can be realized in either of the first or third categories of constructions.

It has been discovered that, by employing a fluorescent dye having a chromophoric unit containing at least 5 fused carbocyclic aromatic rings (hereinafter referred to as a pentacarbocyclic aromatic fluorescent dye), increased stability of organic EL device operation is achieved and a shift to shorter wavelengths of blue emission can be realized. In one preferred form of the invention, the organic EL device is a first category construction in which the blue emitting layer 146 contains a mixed ligand aluminum chelate as a host and at least one pentacarbocyclic aromatic fluorescent dye.

These pentacarbocyclic aromatic fluorescent dyes have been discovered to be highly advantageous for reducing the wavelength of organic EL device emission. To function in a first category arrangement, it is essential that the fluorescent dye absorb at a wavelength corresponding to an emission wavelength of the host compound, in this instance, the mixed ligand aluminum chelate. On the other hand, it is recognized that all fluorescent dyes emit at a longer wavelength than they absorb. Stated another way, a dye cannot emit light of a higher energy level than it absorbs. The difference between the longest wavelength absorption maxima (hereinafter referred to as the peak emission) of a fluorescent dye is known as its Stokes shift. If the Stokes shift of a fluorescent dye is large, it is difficult to achieve efficient spectral coupling and still achieve peak emission at a shorter wavelength than that of the mixed ligand aluminum chelate. Pentacarbocyclic aromatic fluorescent dyes are particularly suited for shifting organic EL device emissions to shorter blue wavelengths, since they exhibit Stokes shifts of from 80 nm to less than 20 nm, attributable to their relatively rigid chromophoric units. Thus, a hypsochromic shift in organic EL device emission can be realized even though the absorption peak of the pentacarbocyclic aromatic fluorescent dye is only 20 nm shorter in wavelength than the emission peak of the aluminum chelate charge carrier compound. Preferred pentacarbocyclic aromatic fluorescent dyes are those that exhibit an absorption peak at wavelengths ranging from 100 to 20 nm shorter than the emission peak exhibited by the aluminum chelate charge carrier compound.

The pentacarbocyclic aromatic fluorescent dyes contemplated each contain at least 5 fused carbocyclic aromatic rings, which form a chromophoric unit. Fused aromatic carbocyclic rings in addition to the 5 required fused rings do not detract from performance characteristics. Preferred chromophoric units contain a perylene, benzopyrene, benzochrysene, benzonaphthacene, picene, pentaphene, pentacene, hexacene or anthanthrene nucleus, as the entire nucleus or fused with other aromatic rings to complete the nucleus. Typically these dyes contain from 20 to 40 ring carbon atoms. An especially preferred fluorescent dye in accordance with the present invention is perylene.

These pentacarbocyclic aromatic rings have the advantage that they can be deposited by vacuum vapor deposition, similarly as the other components of the organic medium. Since the pentacarbocyclic aromatic rings represent chromophores in and of themselves, it is not necessary that other ring substituents be present. However, many dyes containing pentacarbocyclic aromatic rings as chromophores are conventional, having been originally prepared for use in solution chemistry and therefore having substituents intended to modify solubility and, in some instances, hue. Various ring substituents of the pentacarbocyclic aromatic rings of the types disclosed by Tang et al (R-2), cited above, are contemplated.

When fluorescent pentacarbocyclic aromatic dyes are incorporated in a mixed ligand aluminum chelate host charge acceptor compound in a first category combination, only a small amount of the fluorescent dye is required to realize advantages. Fluorescent pentacarbocyclic aromatic dyes are preferably incorporated in a concentration ranging from 0.05 to 5 mole percent, based on the moles of charge accepting compound. A specifically preferred concentration range is from 0.2 to 3 mole percent, based on the moles of charge accepting compound, with a concentration range of from 0.5 to 2 mole percent, based on the moles of charge accepting compound, being in most instances optimum.

Since it is the potential gradient maintained across the organic electroluminescent medium 120 that is responsible for electroluminescence, constructing the organic EL device with the thinnest possible organic medium allows electroluminescence to be achieved with a minimum potential difference between the anode and cathode of the device. Therefore, the smallest practical thickness of the organic medium is preferred. Typically, the thickness of the organic medium is less than 1 μm, preferably less than 5000 Å. The minimum thickness of the organic medium 120 is determined by the minimum thicknesses of the component zones and layers. To avoid quenching of luminescence the cathode 160 should be separated from the junction 150 by a distance of at least 300 Å, i.e., the electron injecting and transporting zone 140 preferably has a thickness of at least 300 Å. The only remaining constraint on construction dimensions are the minimum layer thicknesses required to assure continuous layers. Each of the layers 132, 134, 142, 144 and 146 has a minimum thickness of at least 20 Å and preferably at least 50 Å. Although the hole injecting and transporting zone 130 can therefore be quite thin, it is preferred that this zone also have a thickness of at least 300 Å.

Among compounds other than the previously described metal oxinoid charge accepting host compounds that are useful in forming thin films suitable for constructing the electron injecting layer 142 within the preferred thickness ranges are the butadienes, such as 1,4-diphenylbutadiene and tetraphenylbutadiene; coumarins; and stilbenes, such as trans-stilbene, disclosed by Tang, U.S. Pat. No. 4,356,429, cited above.

Still other thin film forming electron injecting and transporting zone compounds which can be used to form the layer adjacent the cathode are optical brighteners, particularly those disclosed by VanSlyke et al., U.S. Pat. No. 4,539,507, cited above.

Still other optical brighteners that are contemplated to be useful are listed in Vol. 5 of *Chemistry of Synthetic Dyes*, 1971, pages 618–637 and 640. Those that are not already thin-film-forming can be rendered so by attaching an aliphatic moiety to one or both end rings.

In a preferred form of the invention, a porphyrinic compound forms the hole injecting layer 132 of the organic EL device 100. A porphyrinic compound is any compound, natural or synthetic, which is derived from or includes the porphyrin structure. Any of the porphyrinic compounds disclosed by Adler, U.S. Pat. No. 3,935,031, or Tang, U.S. Pat. No. 4,356,429, the disclosures of which are here incorporated by reference, can be employed.

Highly preferred examples of useful porphyrinic compounds include metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead and platinum.

Illustrative of useful porphyrinic compounds are the following:

Porphine
1,10,15,20-Tetraphenyl-21H,23H-porphine copper (II)
1,10,15,20-Tetraphenyl-21H,23H-porphine zinc (II)
5,10,15,20-Tetrakis(pentafluorphenyl)-21H,23H-porphine
Silicon phthalocyanine oxide
Aluminum phthalocyanine chloride
Phthalocyanine (metal free)
Dilithium phthalocyanine
Copper tetramethylphthalocyanine
Copper phthalocyanine
Chromium phthalocyanine fluoride
Zinc phthalocyanine
Lead phthalocyanine
Titanium phthalocyanine oxide
Magnesium phthalocyanine
Copper octamethylphthalocyanine The hole transporting layer 134 of the organic EL device 100 preferably contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al., U.S. Pat. No. 3,180,730. Other suitable triarylamines substituted with vinyl or vinylene radicals and/or containing at least one active hydrogen containing group are disclosed by Brantley et al., U.S. Pat. Nos. 3,567,450 and 3,658,520.

A preferred class of aromatic tertiary amines are those which include at least two aromatic tertiary amine moieties. Such compounds include those represented by the formula

$$Q^1-G-Q^2$$

where $Q^1$ and $Q^2$ are independently aromatic tertiary amine moieties and G is a linking group such as arylene, cycloalkylene, or alkylene group or a carbon to carbon bond.

A particularly preferred class of triarylamines containing two triarylamine moieties can be represented by the formula

$$R^1-\underset{\underset{R^4}{|}}{\overset{\overset{R^2}{|}}{C}}-R^3$$

where $R^1$ and $R^2$ each independently represents a hydrogen atom, an aryl group or alkyl group, or $R^1$ and $R^2$ together represent the atoms completing a cycloalkyl group, and $R^3$ and $R^4$ each independently represents an aryl group, which is in turn substituted with a diaryl substituted amino group, as indicated by the formula where $R^5$ and $R^6$ are independently selected aryl groups.

Another preferred class of aromatic tertiary amines are tetraaryldiamines. Preferred tetraaryldiamines include two diarylamino groups linked through an arylene group. Preferred tetraaryldiamines include those represented by the formula where Are is an arylene group, n is an integer of from 1 to 4, and Ar, $R^7$, $R^8$, and $R^9$ are independently selected aryl groups.

The various alkyl, alkylene, aryl, and arylene moieties of the four structural formulas immediately preceding can each in turn be substituted. Typical substituents including alkyl, alkoxy, aryl, and aryloxy groups, and halogen such as fluoride, chloride, and bromide. The various alkyl and alkylene moieties typically contain from about 1 to 5 carbon atoms. The cycloalkyl moieties can contain from 3 to about 10 carbon atoms, but typically contain five, six, or seven ring carbon atoms, e.g., cyclopentyl, cyclohexyl, and cycloheptyl ring structures. The aryl and arylene moieties are preferably phenyl and phenylene.

Representative useful aromatic tertiary amines are disclosed by Berwick et al., U.S. Pat. No. 4,175,960 and VanSlyke et al., U.S. Pat. No. 4,539,507. Berwick et al. in addition discloses as useful hole transporting compounds N-substituted carbazoles, which can be viewed as ring bridged variants of the diaryl and triarylamines disclosed above.

Following the teachings of VanSlyke et al., U.S. Pat. No. 5,061,569, cited above and incorporated herein by reference, it is possible to achieve higher organic EL device stabilities both during short term and extended operation by substituting for one or more of the aryl groups attached directly to a tertiary nitrogen atom in the aromatic tertiary amines described above an aromatic moiety containing at least two fused aromatic rings. The best combination of both short term (0-50 hours) and long term (0-300+hours) of operation are achieved when the aromatic tertiary amines are those that are comprised of at least two tertiary amine moieties and include an aromatic moiety containing at least two fused aromatic rings attached to a tertiary amine nitrogen atom. The fused aromatic ring moieties of the tertiary amines can contain 24 or more carbon atoms and preferably contain from about 10 to 16 ring carbon atoms. While unsaturated 5 and 7 membered rings can be fused to six membered aromatic rings, i.e., benzene rings, to form useful fused aromatic ring moieties, it is generally preferred that the fused aromatic ring moiety include at least two fused benzene rings. The simplest form of a fused aromatic ring moiety containing two fused benzene rings is naphthalene. Therefore, the preferred aromatic ring moieties are naphthalene moieties, where the latter is understood to embrace all compounds containing a naphthalene ring structure. In monovalent form the naphthalene moieties are naphthyl moieties, and in their divalent form the naphthalene moieties are naphthylene moieties.

Illustrative of useful aromatic tertiary amines are the following:

1,1-Bis(4-di-p-tolyaminophenyl)-cyclohexane
1,1-Bis(4-di-p-tolylaminophenyl-4-phenylcyclohexane
4,4'''-Bis(diphenylamino)quaterphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4,4'-diamino-biphenyl
N,N,N',N'-Tetraphenyl-4,4'-diamino-biphenyl
N-Phenylcarbazole
Poly(N-vinylcarbazole)
4,4'-Bis[N-(1-naphthyl)-N-phenyl-amino]biphenyl
4,4''-Bis[N-(1-naphthyl)-N-phenyl-amino]p-terphenyl
4,4'-Bis[N-(2-naphthyl)-N-phenyl-amino]biphenyl
4,4'-Bis[N-(3-acenaphthenyl)-N-phenylamino]biphenyl
1,5-Bis[N-(1-naphthyl)-N-phenyl-amino]naphthalene
4,4'-Bis[N-(9-anthryl)-N-phenyl-amino]biphenyl
4,4''-Bis[N-(1-anthryl)-N-phenyl-amino]p-terphenyl
4,4'-Bis[N-(2-phenanthryl)-N-phenyl-amino]biphenyl
4,4'-Bis[N-(8-fluoranthenyl)-N-phenyl-amino]biphenyl
4,4'-Bis[N-(2-pyrenyl)-N-phenyl-amino]biphenyl
4,4'-Bis[N-2-perylenyl)-N-phenyl-amino]biphenyl
4'4'-Bis[N-(1-coronenyl)-N-phenyl-amino]biphenyl
2,6-Bis(di-p-tolylamino)naphthalene
2,6-Bis[di-(1-naphthyl)amino]naphthalene
2,6-Bis[di-(1-naphthyl)amino]naphthalene
2,6-Bis[N-(1-naphthyl)-N-(2-naphthyl)amino]naphthalene
4,4''-Bis[N,N-di(2-naphthyl)amino]terphenyl
4,4'-Bis{N-phenyl-N-[4-(1-naphthyl)phenyl]amino}biphenyl
4,4'-Bis[N-phenyl-N-(2-pyrenyl)-amino]biphenyl
2,6-Bis[N,N-di(2-naphthyl)-amine]fluorene
4,4''-Bis(N,N-di-p-tolylamino)-terphenyl
Bis(N-1-naphthyl)(N-2-naphthyl)amine The anode and cathode of the internal junction organic EL device can each take any convenient conventional form, such as any of the various forms disclosed by Tang et al., U.S. Pat. No. 4,885,211, the disclosure of which is here incorporated by reference. Preferred transparent anodes are formed of a conductive oxide, such as indium tin oxide (ITO). When the anode is not intended to be light transmissive, it can be formed of any of a wide range of metals having a work function of at least 4.0 eV. The preferred cathodes are those constructed of a combination of a metal having a work function less than 4.0 eV and one other metal, preferably a metal having a work function greater than 4.0 eV. The proportions of the two metals comprising the combination can be varied over a very wide range. The Mg:Ag cathodes of Tang et al., U.S. Pat. No. 4,885,211, constitute one preferred cathode construction. Aluminum and magnesium cathodes with magnesium constituting at least 0.05 (preferably at least 0.1) percent and aluminum constituting at least 80 (preferably at least 90) percent constitute another preferred cathode construction. The aluminum and magnesium cathodes are the subject of VanSlyke et al., U.S. Pat. No. 5,059,862, cited above. Another contemplated cathode construction is disclosed by Scozzafava et al., U.S. Pat. No. 5,073,446, cited above, wherein the cathode is constructed of fused metal particles containing at least 80 percent indium and a lower work function metal, such as magnesium. In the preferred form, the metal particles have a mean diameter of less than 1 μm and a coefficient of variation of less than 20 percent.

Since cathodes must contain at least one lower (less than 4.0 eV) work function metal to be efficient, cathodes benefit from constructions that protect the lower work function metal from oxidation. It is specifically contemplated to construct the cathode as taught by Littman et al., U.S. Pat. No. 5,059,861, cited above. In this arrangement, the portion of the cathode contacting the organic medium contains at least one metal having a work function of <4.0 eV. The cathode additionally includes a capping layer containing at least one alkaline earth or rare earth metal. The metal in the cathode having a work function of <4.0 eV is selected to have a higher work function than the alkaline earth or rare earth metal in the capping layer.

It is additionally contemplated to construct the cathode as taught by VanSlyke, U.S. Pat. No. 5,047,687, cited above. In this construction the cathode contains at least one metal having a work function of <4.0 eV (other than an alkali metal), and a protective layer comprised of a metal having a work function in the range of from 4.0 to 4.5 eV and at least one organic component of the organic electroluminescent medium, preferably a stilbene or chelated oxinoid compound, overlies the cathode.

The following examples further illustrate the invention.

EXAMPLE 1

Preparation of Control Red Light Emitting Electroluminescent Device

The EL device was prepared by thermal vapor deposition at a chamber pressure of less than $1 \times 10^{-5}$ torr. On an anode comprising indium tin oxide coated on a glass substrate was deposited a 375 Å-thick layer of copper phthalocyanine. On this hole injecting layer was next deposited a 375 Å-thick hole transporting layer of 4,4'-bis[N-(1-naphthyl)-N-phenylamino]biphenyl. Next, a 350 Å-thick red light emitting electron transporting layer of aluminum trisoxine containing 0.5 mole percent of 4-(dicyanomethylene)-2-methyl-6-(p-dimethylaminostyryl)-4H-pyran was deposited, followed by a 350 Å-thick electron injecting layer of undoped aluminum trisoxine. The device was completed by the deposit of a 2000 Å-thick Mg:Ag cathode containing 88 atomic percent Mg.

Biasing the cathode −8.7 volts with respect to the anode resulted in a current density of 20 mA/cm$^2$ and a luminous sterance of 486 cd/m$^2$. The light from the device was orange-red, with 1931 CIE color coordinates of X=0.45 and Y=0.52. (A description of the 1931 CIE chromaticity diagram is given in T. H. James, editor, *The Theory of the Photographic Process*, Fourth Edition, Macmillan, New York, 1977, pages 563–565).

EXAMPLE 2

Preparation of Control Blue Light Emitting Electroluminescent Device

An EL device was prepared as described in Example 1, except that a 150 Å-thick blue light emitting recombination layer of bis(-2-methyl-8-quinolinolato)-(2-phenylphenolato) aluminum (III) was deposited instead of the red light emitting layer.

Biasing the cathode-8.8 volts with respect to the anode resulted in a current density of 20 mA/cm$^2$ and a luminous sterance of 193 cd/m$^2$. The light from this device was blue, with 1931 CIE color coordinates of X=0.16 and Y=0.19.

EXAMPLE 3

Preparation of White Light Emitting Electroluminescent Device

An EL device was prepared as in Example 1, except that the blue light emitting layer described in Example 2 was deposited on the hole transport layer, followed by deposition of the red light emitting layer, the electron injecting layer, and the cathode as described in Example 1.

Biasing the cathode −10.5 volts with respect to the anode resulted in a current density of 20 mA/cm$^2$ and a luminous sterance of 359 cd/m$^2$. The light from this device was white, with 1931 CIE color coordinates of X=0.33 and Y=0.34.

This result demonstrates the production of white light by an organic electroluminescent device comprising a combination of fluorescent materials that emit broad band red light and broad band blue light, in accordance with the present invention.

The invention has been described in detail with particular reference to preferred embodiments thereof, but it will be understood that variations and modifications can be effected within the spirit and scope of the invention.

PARTS LIST 100 organic EL device
106 transparent support
108 conductive layer
110 anode
120 organic electroluminescent medium
130 hole injecting and transporting zone
132 hole injecting layer
134 hole transporting layer
140 electron injecting and transporting zone
142 electron injecting layer
144 red light emitting electron transporting layer
146 blue light emitting recombination layer
150 junction
160 cathode

What is claimed is:

1. An internal junction organic electroluminescent device comprising, in sequence, an anode, an organic electroluminescent medium, and a cathode, said organic electroluminescent medium further comprising a hole injecting and transporting zone contiguous with said anode and an electron injecting and transporting zone contiguous with said cathode, said electron injecting and transporting zone further comprising an electron injecting layer in contact with said cathode, characterized in that a portion of said organic electroluminescent medium that is interposed between said electron injecting layer and said hole injecting and transporting zone is capable of emitting white light in response to hole-electron recombination and comprises a fluorescent material and a mixed ligand aluminum chelate of the formula where Q in each occurrence represents a substituted 8-quinolinolato ligand, R$^s$ represents an 8-quinolinolato ring substituent chosen to block sterically the attachment of more than two substituted 8-quinolinolato ligands to the aluminum atom, O—L is a phenolato ligand, and L is a hydrocarbon group that includes a phenyl moiety.

2. An internal junction organic electroluminescent device according to claim 1 wherein said portion of the organic electroluminescent medium that is interposed between said electron injecting layer and said hole injecting and transporting zone comprises a red light emitting electron transporting layer contiguous with said electron injecting layer and a blue light emitting recombination layer contiguous with said hole injecting and transporting zone.

3. An internal junction organic electroluminescent device according to claim 2 wherein said red light emitting electron transporting layer comprises a fluorescent material capable of emitting light in response to hole-electron recombination and a metal oxinoid compound of the formula where M represents a metal, n is an integer from 1 to 3 and Z represents the atoms necessary to complete an oxine nucleus.

4. An internal junction organic electroluminescent device according to claim 3 wherein said fluorescent material is a polymethine dye, a dicyanomethylenepyran dye, a dicyanomethylenethiopyran dye, a pyrylium dye, or a thiopyrylium dye.

5. An internal junction organic electroluminescent device according to claim 3 wherein said metal oxinoid compound is a trisoxine chelate of aluminum.

6. An internal junction organic electroluminescent device according to claim 3 wherein said fluorescent material is present in a concentration of from $10^{-3}$ to 10 mole percent, based on the moles of said metal oxinoid compound.

7. An internal junction organic electroluminescent device according to claim 2 wherein said blue light emitting recombination layer comprises a fluorescent material capable of emitting light in response to hole-electron recombination and a mixed ligand aluminum chelate of the formula (R$^s$—Q)$_2$—Al—O—L where Q in each occurrence represents a substituted 8-quinolinolato ligand, R$^s$ represents an 8-quinolinolato ring substituent chosen to block sterically the attachment of more than two substituted 8-quinolinolato ligands to the aluminum atom, O—L is a phenolato ligand, and L is a hydrocarbon group that includes a phenyl moiety.

8. An internal junction organic electroluminescent device according to claim 7 wherein said fluorescent material is a pentacarbocyclic aromatic fluorescent dye.

9. An internal junction organic electroluminescent device according to claim 8 wherein said pentacarbocyclic aromatic fluorescent dye contains a perylene, benzopyrene, benzochrysene, benzonaphtharene, picene, pentaphene, pentacene, hexacene, or anthanthrene nucleus.

10. An internal junction organic electroluminescent device according to claim 9 wherein said pentacarbocyclic aromatic fluorescent dye is perylene.

11. An internal junction organic electroluminescent device according to claim 7 wherein said fluorescent material is present in a concentration of from 0.05 to 5 mole percent, based on the moles of said mixed ligand aluminum chelate.

12. An internal junction organic electroluminescent device according to claim 7 wherein said mixed ligand aluminum chelate satisfies the formula wherein L is a hydrocarbon group that includes a phenyl moiety and R$^2$ to R$^7$ represent substituents at each of ring positions 2 to 7 of the 8-quinolinolato rings.

13. An internal junction organic electroluminescent device according to claim 7 wherein R$^s$ is a 2-position substituent of the 8-quinolinolato ring nucleus.

14. An internal junction organic electroluminescent device according to claim 13 where R$^s$ is a hydrocarbon group of 1 to 6 carbon atoms.

15. An internal junction organic electroluminescent device according to claim 14 wherein R$^s$ is a methyl group.

16. An internal junction organic electroluminescent device according to claim 7 wherein L contains a naphthalene nucleus.

17. An internal junction organic electroluminescent device according to claim 7 wherein said phenyl moiety includes an aliphatic or aromatic hydrocarbon substituent of 1 to 12 carbon atoms.

18. An internal junction organic electroluminescent device according to claim 1 wherein said hole injecting and transporting zone comprises a hole injecting layer and a hole transporting layer.

19. An internal junction organic electroluminescent device according to claim 18 wherein said hole injecting layer comprises a porphyrinic compound.

20. An internal junction organic electroluminescent device according to claim 18 wherein said hole transporting layer comprises an aromatic tertiary amine.

21. An internal junction organic electroluminescent device according to claim 20 wherein said aromatic tertiary amine is a tetraaryldiamine of the formula where Are is an arylene group, n is an integer of from 1 to 4, and Ar, R$^7$, R$^8$, and R$^9$ are independently selected aryl groups.

22. An internal junction organic electroluminescent device according to claim 1 wherein said cathode comprises a metal having a work function less than 4.0 eV and a metal having a work function greater than 4.0 eV.

23. An internal junction organic electroluminescent device according to claim 22 wherein said cathode comprises magnesium and silver.

24. An internal junction organic electroluminescent device according to claim 1 wherein said organic electroluminescent medium has a thickness of less than 1 μm.

25. An internal junction organic electroluminescent device according to claim 1 wherein said electron injecting and transporting zone has a thickness of at least 300 Å.

* * * * *